United States Patent
Ou et al.

(10) Patent No.: US 10,489,246 B2
(45) Date of Patent: *Nov. 26, 2019

(54) DATA STORAGE DEVICE AND DATA MAINTENANCE METHOD THEREOF

(71) Applicant: Silicon Motion, Inc., Jhubei (TW)

(72) Inventors: Hsu-Ping Ou, Zhubei (TW); Ho-Chien Hsu, Xinfeng Township (TW)

(73) Assignee: Silicon Motion, Inc., Jhubei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/173,799

(22) Filed: Oct. 29, 2018

(65) Prior Publication Data

US 2019/0073264 A1    Mar. 7, 2019

Related U.S. Application Data

(63) Continuation of application No. 15/694,543, filed on Sep. 1, 2017, now Pat. No. 10,157,099.

(30) Foreign Application Priority Data

Oct. 7, 2016    (TW) .............................. 105132524 A

(51) Int. Cl.
*G11C 16/04* (2006.01)
*G06F 11/10* (2006.01)
*G11C 29/52* (2006.01)
*G11C 29/04* (2006.01)

(52) U.S. Cl.
CPC .......... *G06F 11/1072* (2013.01); *G11C 29/52* (2013.01); *G11C 2029/0411* (2013.01)

(58) Field of Classification Search
CPC ............. G11C 29/52; G11C 2029/0411; G06F 11/1072
See application file for complete search history.

(56) References Cited

U.S. PATENT DOCUMENTS

| | | | | |
|---|---|---|---|---|
| 8,634,243 B2 * | 1/2014 | Lin | ........................ | G11C 16/10 365/185.03 |
| 9,170,937 B2 * | 10/2015 | Hsiao | .................. | G06F 12/0246 |
| 9,747,173 B2 * | 8/2017 | Ke | ........................ | G06F 3/0619 |
| 10,157,099 B2 * | 12/2018 | Ou | ...................... | G06F 11/1072 |

* cited by examiner

*Primary Examiner* — Pho M Luu
(74) *Attorney, Agent, or Firm* — Wang Law Firm, Inc.

(57) ABSTRACT

A data storage device includes a flash memory. The flash memory includes a plurality of weak pages and a plurality of strong pages, wherein each of the strong pages is paired with one of the weak pages, and each of the strong pages has error-correction information of the paired weak page.

20 Claims, 6 Drawing Sheets

DATA STORAGE DEVICE AND DATA MAINTENANCE METHOD THEREOF

CROSS REFERENCE TO RELATED APPLICATIONS

This Application is a Continuation application of U.S. Pat. No. 10,157,099 issued on Dec. 18, 2018, which claims priority of Taiwan Patent Application No. 105132524, filed on Oct. 7, 2016, the entirety of which are incorporated by reference herein.

BACKGROUND OF THE INVENTION

Field of the Invention

The present invention relates to a data maintenance method of memory device, and in particular to a data maintenance method of error correcting.

Description of the Related Art

Flash memory is considered a non-volatile data-storage device that uses electrical methods to erase and program itself. NAND Flash, for example, is often used in memory cards, USB flash devices, solid state devices, eMMCs, and other memory devices.

Flash memory, such as NAND FLASH, includes a plurality of blocks. Each of the blocks has a plurality of pages, wherein the minimum write unit of the flash memory is a page, and the minimum erase unit of the flash memory is a block. The stored data may be read out incorrectly from the flash memory. The current solution is encoding the original data which is arranged to be stored into the flash memory and storing the encoded data into the flash memory, so that the encoded data will be read out and decoded to obtain the original data during the read operation. Therefore, it is important to find a way to use the encoded data efficiently in the current memory field.

BRIEF SUMMARY OF THE INVENTION

A detailed description is given in the following embodiments with reference to the accompanying drawings.

An exemplary embodiment provides a data storage device including a flash memory. The flash memory includes a plurality of weak pages and a plurality of strong pages, wherein each of the strong pages is paired with one of the weak pages, and each of the strong pages comprises error-correction information of the paired weak page.

Another exemplary embodiment provides a data maintenance method applied to a data storage device having a flash memory, wherein the flash memory includes a plurality of weak pages and a plurality of strong pages, and each of the strong pages is paired with one of the weak pages. The data maintenance method includes: receiving a read command, wherein the read command is arranged to read a first weak page of the weak pages; reading the first weak page according to the read command; and reading a first strong page paired with the first weak page to correct the first weak page when data of the first weak page cannot be successfully corrected.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
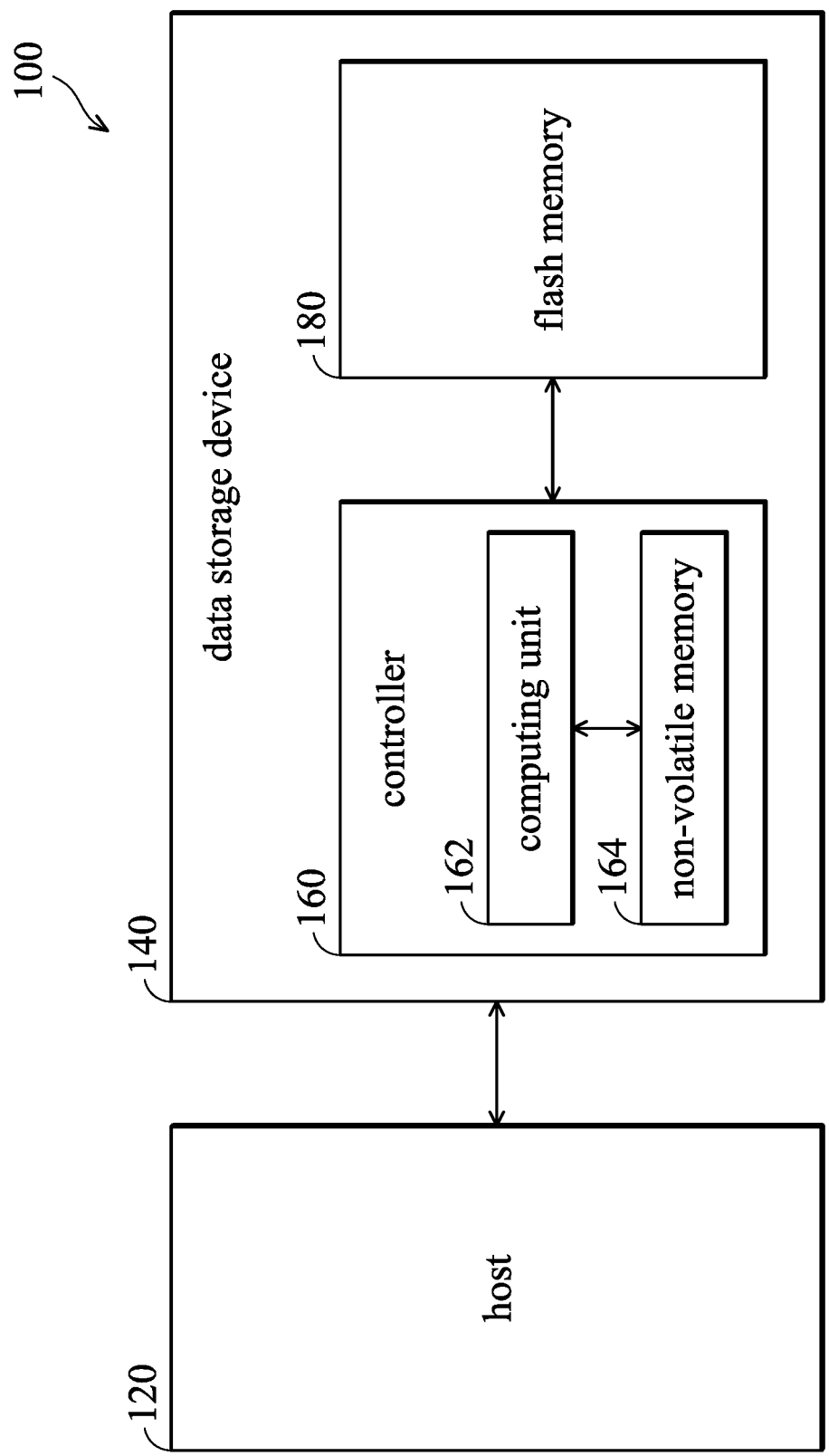
FIG. 1 is a schematic diagram illustrating an embodiment of an electronic system of an exemplary embodiment.

FIG. 1 is a schematic diagram illustrating an embodiment of an electronic system of an exemplary embodiment. The electronic system 100 includes a host device 120 and a data storage device 140. The data storage device 140 includes a controller 160 and a flash memory 180. Furthermore, the data storage device 140 may operate in response to the commands received from the host device 120.

The controller 160 includes a computing unit 162 and a non-volatile memory 164 (ROM). The non-volatile memory 164, the program code stored in the non-volatile memory 164 and data stored in the non-volatile memory 164 constitute firmware executed by the processing unit 162, and the controller 160 is configured to control the flash memory 180 based on the firmware. Moreover, the computing unit 162 further includes an error correction engine (not shown). The error correction engine is arranged to perform error correction (ECC) on the retrieved data to correct the retrieved data when the retrieved data is wrong, but it is not limited thereto. It should be noted that, in one of the embodiments, the non-volatile memory 164 includes software or firmware arranged to enable the computing unit 162 to encode the user data arranged to be stored in the pages into parity code(s). Furthermore, the software or firmware stored in the non-volatile memory 164 are also configured to enable the computing unit 162 to encode the parity codes of the user data stored in some pages into advanced parity code(s) of the parity codes. When the retrieved data has at least one error bit, the controller 160 performs error correction on the retrieved data by using the parity codes or the advanced parity codes to correct the error bit and successfully read the pages.

The flash memory 180 includes a plurality of blocks, and each of the blocks has a plurality of pages. Moreover, the flash memory 180 further includes a plurality of word lines that are arranged in sequence and adjacent to each other, and a plurality of bit lines that are arranged in sequence and adjacent to each other, wherein each of the word lines controls at least one page. Namely, a specific page can be selected by enabling the corresponding word line. For example, each of the word lines includes a page when the flash memory 180 operates as a Single-Level Cell (SLC). When the flash memory 180 operates as a Multi-Level Cell (MLC), each of the word lines includes two pages which are a strong page LSB and a weak page MSB. When the flash memory 180 operates as a Triple-Level Cell (TLC), each of the word lines includes three pages which are a strong page LSB, a middle page CSB and a weak page MSB, but it is not limited thereto.

It is because of the physical characteristics of the flash memory 180 that the data retention ability of the weak page MSB is normally weaker than that of the middle page CSB and the strong page LSB, and the data retention ability of the strong page LSB is normally stronger than that of the middle page CSB and the weak page MSB. Therefore, in one of the embodiments of the present invention, each of the weak pages is paired with one strong page for improving the data retention ability of the weak page through the paired strong page. Namely, the embodiment can store the error-correction information of the weak page in the paired strong page to protect the data of the weak page. Moreover, when a page is damaged, the other pages that belong to the word line including the damaged page will have a high probability of being broken, and the pages belonging to the adjacent word line might be damaged too. Therefore, in one of the embodiments, the strong page paired with the weak page will belong to a different word line than the weak page, and the word line of the paired strong page will be at least one word line away from the word line of the weak page. The details are as follows.

Figure 2:
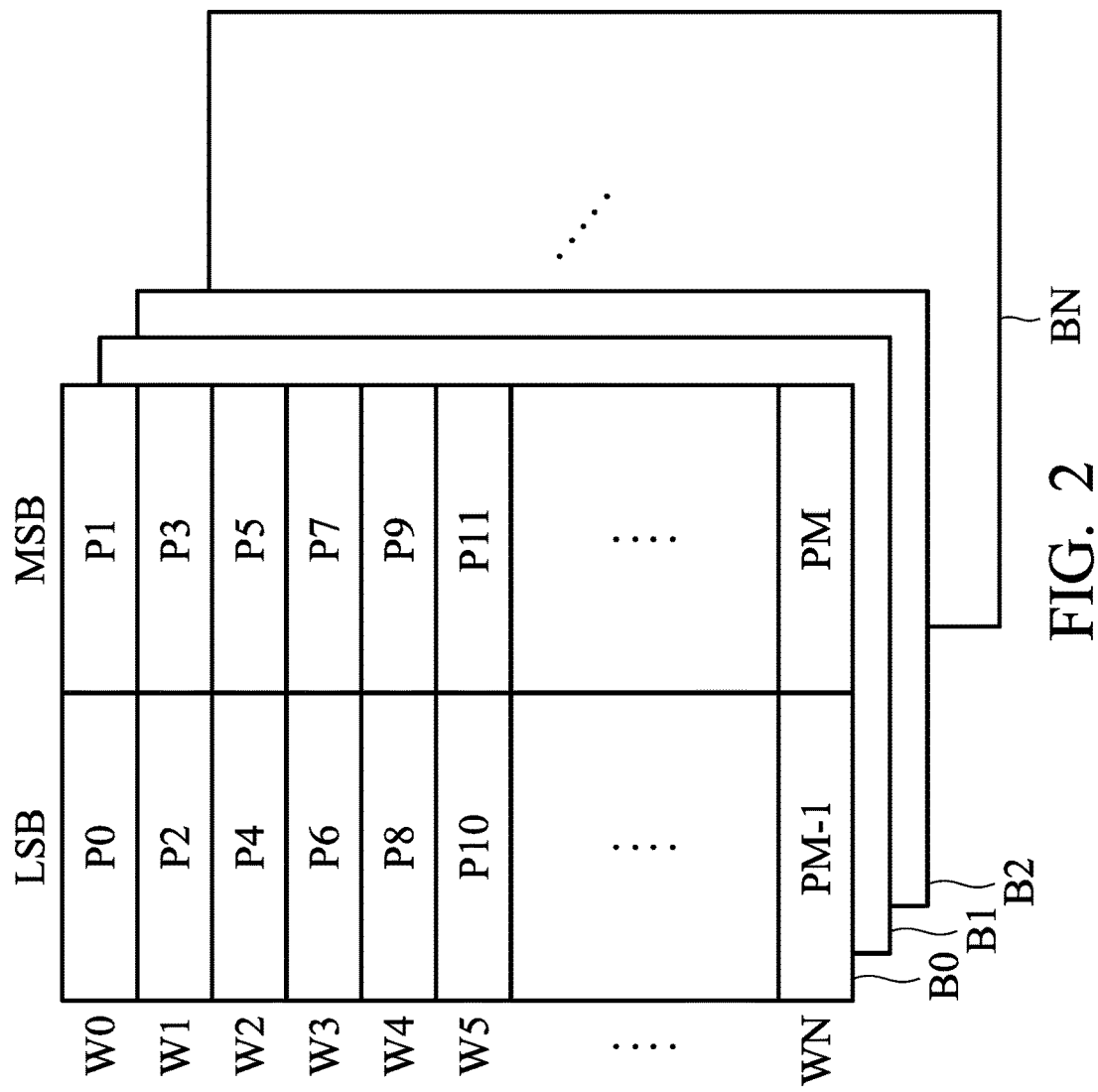
FIG. 2 is a schematic diagram illustrating an embodiment of a flash memory of an exemplary embodiment.

FIG. 2 is a schematic diagram illustrating an embodiment of a flash memory of an exemplary embodiment. The flash memory 180 shown in FIG. 2 operates as a Multi-Level Cell. In this embodiment, the flash memory 180 includes a plurality of blocks B0~BN, and each of the blocks has a plurality of pages P0~PM, wherein the pages P0, P2, P4 . . . PM−1 are strong pages LSB, and the pages P1, P3, P5 . . . PM are weak pages MSB, wherein N and M are positive integers. It should be noted that each of the strong pages has a paired weak page, and the strong page and the paired weak page are included in different word lines. In one embodiment, the word line of the weak page is a distance from the word line of the paired strong page for one word line. For example, the weak page P1 included in the word line W0 is paired with the strong page P4 included in the word line W2, the weak page P3 included in the word line W1 is paired with the strong page P6 included in the word line W3, the weak page P5 included in the word line W2 is paired with the strong page P8 included in the word line W4, and so on. In other embodiments, the word line of the weak page is a distance from the word line of the paired strong page for two, three or four word lines, but it is not limited thereto. The circuit designer can determine the rule for pairing the strong pages and the weak pages according to the program order of the data based on the above teaching.

Figure 3:
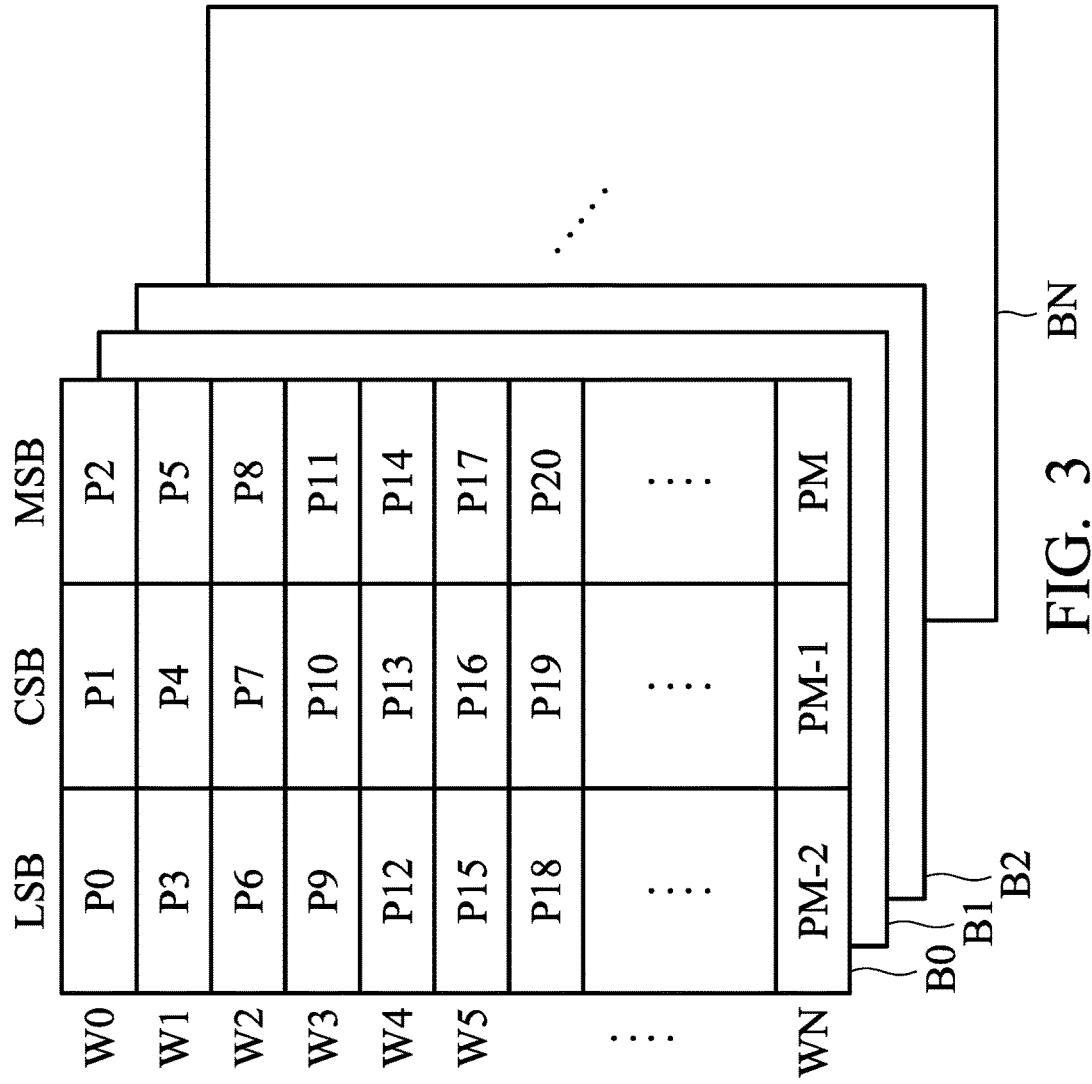
FIG. 3 is a schematic diagram illustrating another embodiment of a flash memory of an exemplary embodiment.

FIG. 3 is a schematic diagram illustrating another embodiment of a flash memory of an exemplary embodiment. The flash memory 180 of FIG. 3 operates as a Triple-Level Cell (TLC). In this embodiment, the flash memory 180 includes a plurality of blocks B0~BN, and each of the blocks B0~BN has a plurality of pages P0~PM, wherein the pages P0, P3, P6 . . . PM−2 are strong pages LSB, the pages P1, P4, P7 . . . PM−1 are middle pages CSB, and the pages P2, P5, P8 . . . PM are weak pages MSB, wherein N and M are positive integers. It should be noted that each of the strong pages is paired with a weak page, and the strong page and the paired weak page belong to different word lines. For example, in one of the embodiments, the weak page P2 included in the word line W0 is paired with the strong page P9 included in the word line W3, the weak page P5 included in the word line W1 is paired with the strong page P12 included in the word line W4, the weak page P8 included in the word line W2 is paired with the strong page P15 included in the word line W5, and so on. In other embodiments, the word line of the weak page is a distant from the word line of the paired strong page have for two, three or four word lines, but it is not limited thereto. The circuit designer can determine the rule for pairing the strong pages and the weak pages according to the program order of the data based on the above teaching.

It should be noted that each of the strong pages includes error-correction information of the paired weak page. More specifically, each of the weak pages has a user data area and a spare area, and each of the strong pages also has a user data area and a spare area. The spare area of the weak page has a first parity code, wherein the first parity code is produced by encoding the data stored in the user data area of the weak page. The spare area of the strong page has a second parity code and error-correction information of the weak page paired with the strong page, wherein the second parity code is produced by encoding the data stored in the user data area of the strong page. In one embodiment, the error-correction information is a third parity code produced by encoding the first parity code stored in the spare area of the weak page paired with the strong page, but it is not limited thereto. In other embodiments, the error-correction information can also be other codes that can be used to correct the error bits of the data in the weak page.

In one of the embodiments, the size of the spare area of the strong page LSB and the size of the spare area of the weak page MSB are the same, and the length of the second parity code of the strong page is shorter than the first parity code of the weak page. For example, the size of the user data area of the strong page LSB, the weak page MSB and the middle page CSB is 1K bytes, and the size of the spare area is 126 bytes, but it is not limited thereto. The spare area of the weak page MSB stores a parity code corresponding to the data stored in the user data area of the weak page MSB, wherein the size of the parity code is 126 bytes. Similarly, the spare area of the middle page CSB stores a parity code corresponding to the data stored in the user data area of the middle page CSB, wherein the size of the parity code is also 126 bytes. The strong page LSB has better data-retention ability than the weak page MSB and the middle page CSB, so that the parity code, which is corresponding to the data of the user data area, in the spare area of the strong page LSB can only be 56 bytes, and the spare area of the strong page LSB further has error-correction information which is 70 bytes, wherein the error-correction information is a parity code produced by encoding the parity code stored in the weak page MSB paired with the strong page LSB. When the controller 160 cannot correct the data of the weak page MSB by using the parity code, which is 126 bytes, in the spare area of the weak page MSB, the controller 160 can perform error correction on the parity code of the weak page MSB by using the error-correction stored in the strong page LSB which is paired with the weak page MSB to decrease the error bits of the weak page MSB, but it is not limited thereto. In other embodiments, any data that can correct the error bits of the weak page MSB can be the error-correction information of the present invention.

Figure 4:
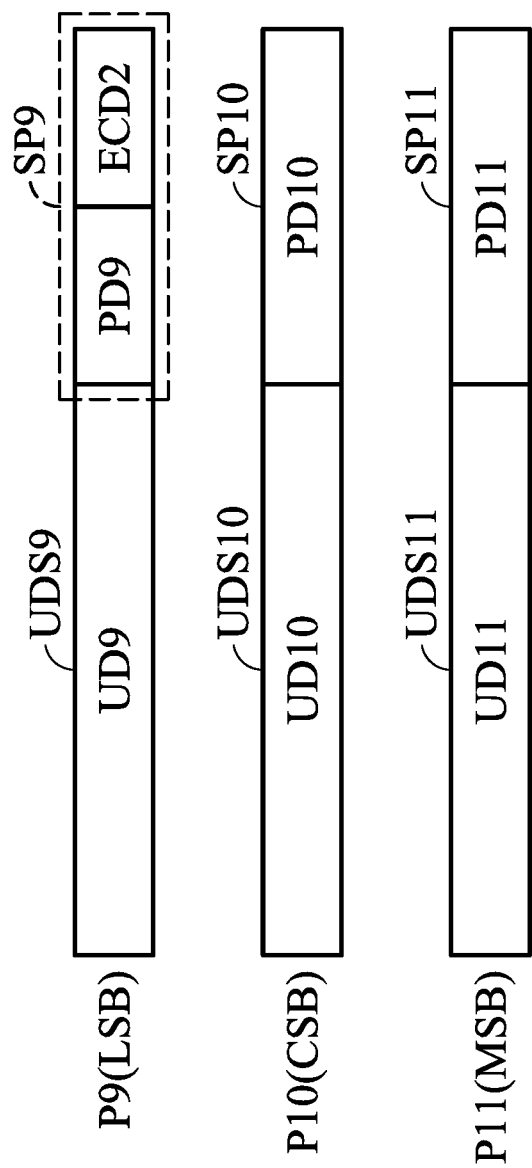
FIG. 4 is a schematic diagram illustrating an embodiment of a word line with a corresponding strong page, middle page and weak page of the flash memory of an exemplary embodiment.

FIG. 4 is a schematic diagram illustrating an embodiment of a word line with a corresponding strong page, middle page and weak page of the flash memory of an exemplary embodiment. Taking as an example the pages of the word line W3 of FIG. 4 when the flash memory 180 operates as a Triple-Level Cell (TLC), the strong page P9 has a user data area UDS9 and a spare area SP9, the middle page P10 has a user data area UDS10 and a spare area SP10, and the weak page P11 has a user data area UDS11 and a spare area SP11. The size of the spare area SP9 of the strong page P9, the size of the spare area SP10 of the middle page P10 and the size of the spare area SP11 of the weak page P11 are the same, but it is not limited thereto. In other embodiments, the size of the spare area SP9 of the strong page P9, the size of the spare area SP10 of the middle page P10 and the size of the spare area SP11 of the weak page P11 can be different. The spare area SP11 of the weak page P11 includes a parity code PD11, wherein the parity code PD11 of the spare area SP11 is produced by encoding the user data UD11 stored in the user data area UDS11. The spare area SP10 of the middle page P10 also has a parity code PD10, wherein the parity code PD10 of the spare area SP10 is produced by encoding the user data UD10 of the user data area UDS10. The spare area SP9 of the strong page P9 includes a parity code PD9 and error-correction information ECD2, wherein the parity code PD9 of the spare area SP9 is produced by encoding the user data UD9 of the user data area UDS9, and the error-correction information ECD2 of the spare area SP9 is arranged to correct the data stored in the weak page P2 which is paired with the strong page P9. In one of the embodiments, the error-correction information ECD2 is another parity code of the parity code of the weak page P2 which is paired with the strong page P9. Namely, the controller 160 is arranged to encode the parity code stored in the spare area of the weak page P2 to obtain another parity code, and to store the obtained parity code into the spare area SP9 of the strong page P9 to serve as error-correction information ECD2. Similarly, the controller 160 encodes the parity code PD11 stored in the spare area SP11 of the weak page P11 to obtain another parity code, and the obtained parity code produced by encoding the parity code PD11 of the spare area SP11 serves as the error-correction information of the weak page P1, and the controller 160 stores the obtained parity code which serves as the error-correction information of the weak page P1 into the spare area of the strong page P18 paired with the weak page P11.

Figure 5:
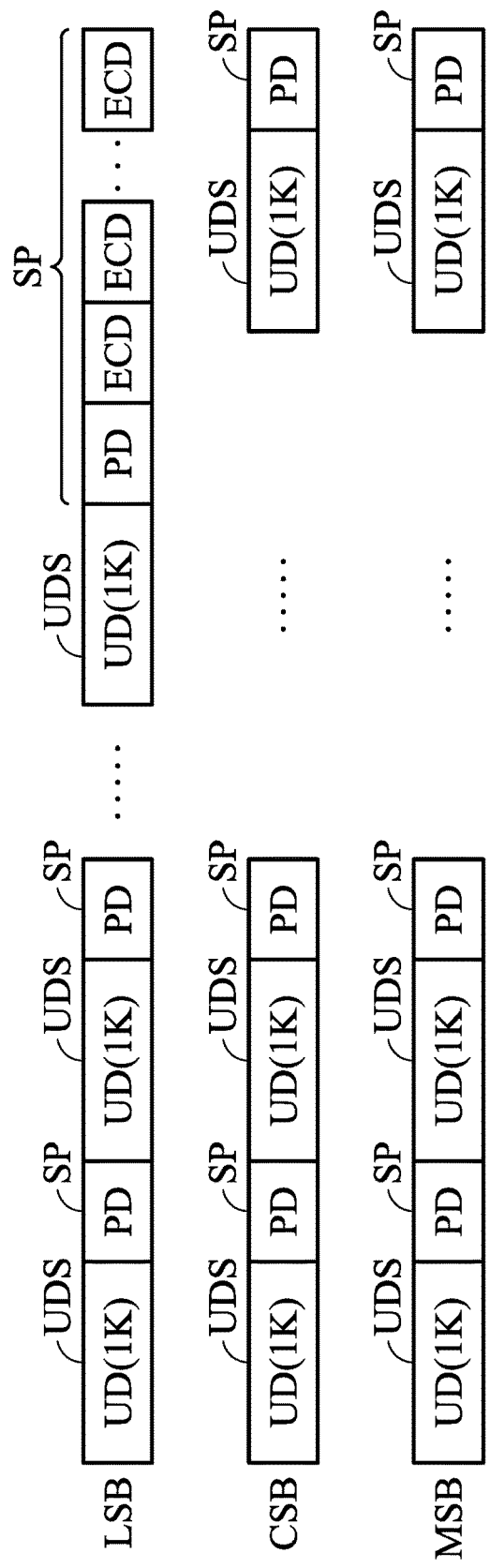
FIG. 5 is a schematic diagram illustrating an embodiment of a page of an exemplary embodiment.

In other embodiments, the size of the user data area can also be 8K bytes or 16K bytes, but it is not limited thereto. For example, FIG. 5 is a schematic diagram illustrating an embodiment of a page of an exemplary embodiment. In this embodiment, the size of a page is 8K+1024 bytes, wherein the size of the user data area UDS of the strong page LSB, the middle page CSB and the weak page MSB are 8K bytes, and the size of the spare area SP of the strong page LSB, the middle page CSB and the weak page MSB are 1024 bytes. More specifically, the user data area UDS and the spare area SP can be divided into eight sectors, wherein the size of each of the divided user data areas UDS of the middle page CSB and the weak page MSB is 1K bytes, and the divided user data areas UDS are arranged to store user data, the size of each of the divided spare areas SP is 128 bytes, 126 bytes of each of the spare areas SP is arranged to store the parity code PD for correcting 72 bits of error in the data of the user data area UDS, and the remaining 2 bytes of each of the spare areas SP is arranged to store the meta data of the corresponding user data area UDS (not shown), wherein the meta data can be a logical address, block erase count, etc., but is it not limited thereto. Similarly, the size of each of the divided user data areas UDS of the strong pages LSB is 1K byte, and the size of each of the divided spare areas SP of the strong pages LSB is 128 bytes. It should be noted that 56 bytes of each of the spare areas SP of the strong page LSB is arranged to store the parity code PD for correcting 32 bits of error of the data in the corresponding user data area UDS, and 2 bytes of each of the spare areas SP of the strong page LSB is arranged to store the meta data of the corresponding user data areas UDS, and the remaining 70 bytes of each of the spare areas SP of the strong page LSB is arranged to store the error-correction information ECD arranged to correct 50 bits of error of the parity code PD in the paired weak page. In this embodiment, for convenience of description, the parity code PD of the spare area SP is deposited after the corresponding user data area UDS, and the error-correction information ECD of the spare area SP of the strong page LSB is deposited in the tail of the strong page LSB, but it is not limited thereto. In other embodiments, the spare area SP can be also deposited at the start of or in the tail of the corresponding user data area UDS. Therefore, the error-correction information ECD of the spare area SP of the strong page LSB can be deposited at the start of the strong page LSB. The other details can be referred to in the description of FIG. 4.

As described above, the controller 160 can perform a read operation on a first weak page in response to a read command arranged to read the first weak page. When the controller 160 cannot successfully correct the data of the first weak page, the controller 160 further reads a first strong page which is paired with the first weak page in the read operation to correct the data of the first weak page. More specifically, in the read operation, the controller 160 reads the first strong page to obtain first error-correction information corresponding to the first weak page, and corrects the first parity code of the first weak page according to the first error-correction information to decrease the number of error bits in the first weak page. When the first error-correction information successfully corrects the first parity code, the controller 160 uses the corrected first parity code to correct the data of the first weak page. When the first error-correction information cannot successfully correct the first parity code, the controller 160 invalidates the data of the first weak page, and moves the other data in the block which includes the first weak page to another block. It should be noted that the above steps are included in the operations of reading the first weak page in response to the read command, so that the controller 160 does not need other commands from the host 120 to perform the above steps.

Figure 6:
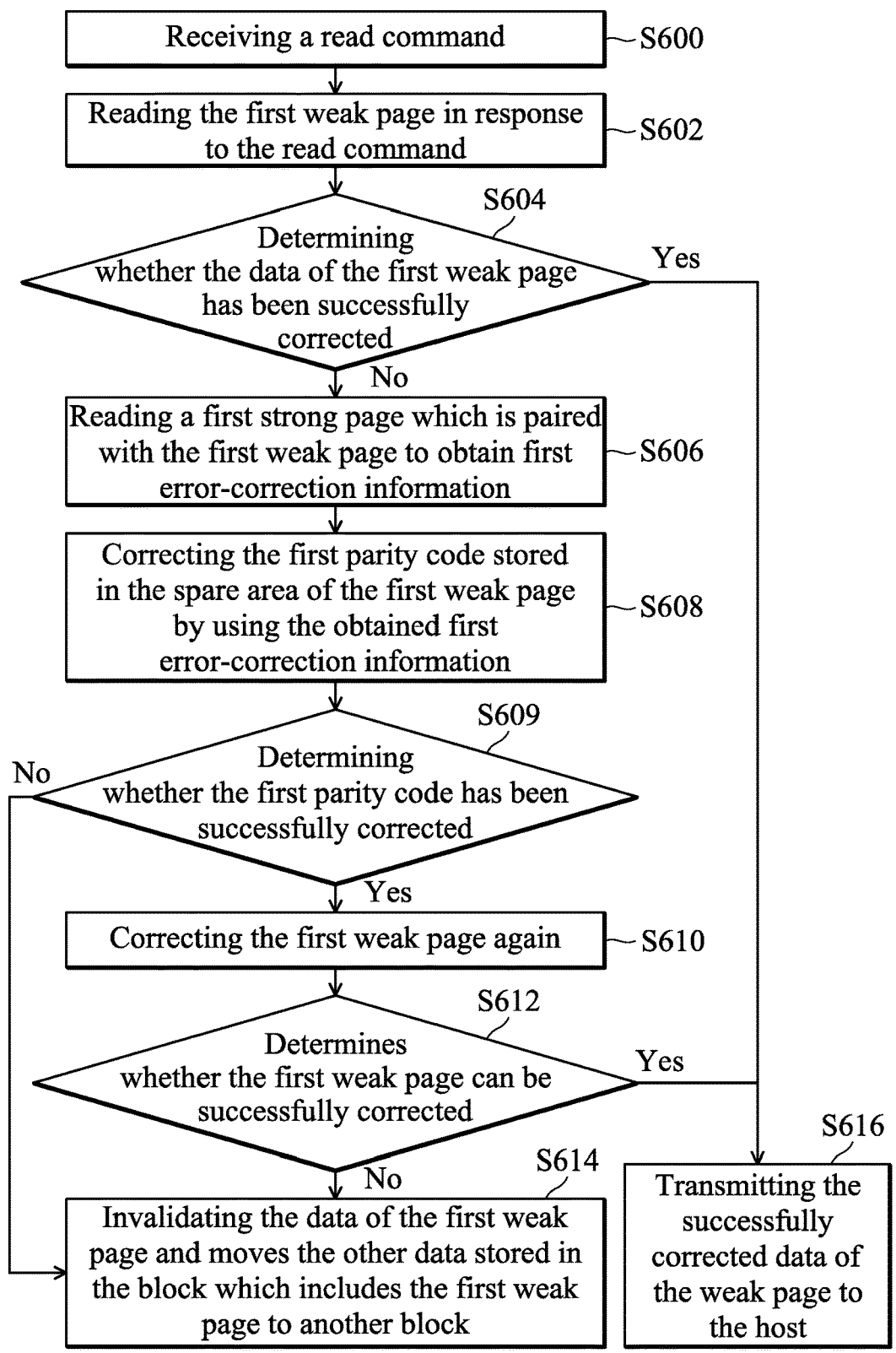
FIG. 6 is a flowchart of a data maintenance method according to exemplary embodiments.

FIG. 6 is a flowchart of a data maintenance method according to exemplary embodiments. The data maintenance method is applied to the data storage device 140 of FIG. 1. The process starts at step S600.

In step S600, the controller 160 receives a read command from the host 120, wherein the read command is arranged to enable the controller 160 to read a first weak page of the weak pages.

Next, in step S602, the controller 160 reads the first weak page in response to the read command. More specifically, the controller 160 uses the first parity code stored in the first spare area of the first weak page to perform an error correction on the data of the first weak page in response to the read command.

Next, in step S604, the controller 160 determines whether the data of the first weak page has been successfully corrected. When the data of the first weak page has been successfully corrected, the process goes to step S616; otherwise, the process goes to step S606. More specifically, when the controller 160 cannot use the first parity code stored in the first spare area of the first weak page to successfully correct the error bits in the data of the first user data area, the process goes to step S606; otherwise the process goes to step S616. Namely, when the number of error bits in the first weak page is more than the number of bits that can be corrected by the first parity code, the process goes to step S606. It should be noted that, in another embodiment, when the data of the first weak page cannot be successfully corrected, the controller 160 further repeatedly reads the first weak page by using a plurality of read voltages in a read-retry table of the flash memory 180. When the first parity code obtained by repeatedly reading the first weak page can be successfully read, the process goes to step S616; otherwise, the process goes to step S606.

In step S606, the controller 160 reads a first strong page which is paired with the first weak page to obtain first error-correction information. More specifically, the controller 160 reads the first error-correction information, which corresponds to the first weak page, from the spare area of the first strong page in step S606.

Next, in step S608, the controller 160 corrects the first parity code stored in the spare area of the first weak page by using the obtained first error-correction information to decrease the number of error bits in the first weak page. In one of the embodiments, the error-correction information is a third parity code produced by encoding the first parity code stored in the spare area of the weak page which is paired with the strong page, but it is not limited thereto. In other embodiments, the error-correction information can also be other codes that can be used to correct the error bits of the data in the weak page.

Next, in step S609, the controller 160 determines whether the first parity code has been successfully corrected. When the controller 160 successfully corrects the first parity code by using the first error-correction information, the process goes to step S610; otherwise, the process goes to step S614. In one embodiment, when the controller 160 cannot use the first error-correction information to successfully correct the first parity code, the controller 160 further repeatedly reads the first strong page by using a plurality of read voltages in the read-retry table, and corrects the first parity code by using the first error-correction information which is repeatedly read from the first strong page. In another embodiment, when the controller 160 cannot successfully correct the first parity code by using the first error-correction information, the controller 160 further performs a read-retry (repeatedly reads) on the first weak page by using the read voltages in the read-retry table, and performs error correction on the first parity code by using the first error-correction information obtained by the read-retry. In one of the embodiments, when the controller 160 cannot successfully correct the first parity code by using the first error-correction information, the controller 160 further repeatedly reads the first strong page paired with the first weak page by using the read voltages of the read-retry table to correct the first parity code obtained by repeated reading by using the first error-correction information obtained by repeatedly reading the first strong page.

In step S610, the controller 160 corrects the first weak page again. More specifically, in one embodiment, the controller 160 uses the corrected first parity code of the first weak page to correct the data of the first user area of the first weak page.

Next, in step S612, the controller 160 determines whether the first weak page can be successfully corrected. When the first weak page can be successfully corrected, the process goes to step S616; otherwise, the process goes to step S614. In one of the embodiments, in step S612, when the controller 160 cannot use the corrected first parity code to successfully correct the error bits of the first user data area, the process goes to step S614; otherwise, the process goes to step S616. It should be noted that, in another embodiment, when the corrected first parity code cannot successfully correct the first weak page, the controller 160 further repeatedly reads the first weak page by using the read voltages in a read-retry table stored in the flash memory 180. When the above corrected first parity code can successfully correct the data of the first user data area of the first weak page which is obtained by repeated reading, the process goes to step S616; otherwise, the process goes to step S614.

In step S614, the controller 160 invalidates the data of the first weak page and moves the other data stored in the block which includes the first weak page to another block. In other embodiments, in step S614, the controller 160 can further mark the read weak page as a bad page. The process ends at step S614.

In step S616, the controller 160 transmits the successfully corrected data of the weak page to the host 120. The process ends at step S616.

The data storage device 140 and the data maintenance method of the present invention can decrease the length of the parity code of the strong page and store the error-correction information of the parity code of the weak page in the remaining space of the strong page to improve the ability of the data retention of the weak page.

Data transmission methods, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a flash memory, comprising:
a plurality of weak pages; and
a plurality of strong pages, wherein each of the strong pages is paired with one of the weak pages, and each of the strong pages comprises error-correction information of the paired weak page, wherein the error-correction information is used to correct the first weak page.

2. The data storage device as claimed in claim 1, wherein the flash memory comprises a plurality of word lines, and each of the word lines comprises one of the strong pages and one of the weak pages, wherein the strong page belongs to the word line that is different from the word line of the paired weak page.

3. The data storage device as claimed in claim 2, wherein the flash memory operates as a Multi-Level Cell, the flash memory further comprises a plurality of middle pages, and each of the word lines comprises one of the strong pages, one of the middle pages, and one of the weak pages.

4. The data storage device as claimed in claim 1, wherein each of the weak pages has a first user data area and a first spare area, each of the strong pages has a second user data area and a second spare area, the first spare area has a first parity code corresponding to the first user data area, the second spare area has a second parity code corresponding to the second user data area, and the length of the second parity code is shorter than the first parity code.

5. The data storage device as claimed in claim 4, wherein the second spare area further comprises the error-correction information, and the error-correction information is a third parity code obtained by encoding the first parity code of the weak page paired with the strong page.

6. The data storage device as claimed in claim 4, further comprising a controller arranged to perform a read operation on a first weak page of the weak pages according to a read command arranged to read the first weak page, wherein when the controller cannot successfully correct the data of the first weak page, the controller further reads a first strong page which is paired with the first weak page in the read operation to correct the data of the first weak page.

7. The data storage device as claimed in claim 6, further comprising a read-retry table, the read-retry table comprises a plurality of read voltages which are different from each other, wherein the controller performs a read-retry operation on the first weak page according to the read voltages when the controller cannot successfully correct the data of the first weak page, and the controller further reads the first strong page to correct the data of the first weak page when the controller cannot successfully correct the data of the first weak page by using the read voltages.

8. The data storage device as claimed in claim 7, wherein in the read operation, the controller reads the first strong page to obtain first error-correction information of the error-correction information corresponding to the first weak page, and correct the data of the first weak page according to the first error-correction information.

9. The data storage device as claimed in claim 8, wherein the controller corrects a first parity code of the first weak page by using the first error-correction information, and the controller further uses the corrected first parity code to correct the data of the first weak page when the first parity code is successfully corrected by the first error-correction information.

10. The data storage device as claimed in claim 9, wherein when the first error-correction information cannot be successfully corrected by the first parity code, the controller invalidates the data of the first weak page and moves the other data stored in the block comprising the first weak page to another block.

11. The data storage device as claimed in claim 9, wherein the controller further repeatedly reads the first strong page by using the read voltages when the first error-correction information cannot successfully correct the first parity code, the controller uses the first error-correction information obtained by repeatedly reading the first strong page to correct the first parity code, and the controller further uses the corrected first parity code to correct the data of the first weak page when the first error-correction information obtained by repeatedly reading the first strong page successfully corrects the first parity code.

12. A data maintenance method, applied to a data storage device having a flash memory, wherein the flash memory comprises a plurality of weak pages and a plurality of strong pages, and each of the strong pages is paired with one of the weak pages, the data maintenance method comprising:
 receiving a read command, wherein the read command is arranged to read a first weak page of the weak pages;
 reading the first weak page according to the read command; and
 when data of the first weak page cannot be successfully corrected, reading a first strong page paired with the first weak page to correct the first weak page.

13. The data maintenance method as claimed in claim 12, further comprising:
 When the data of the first weak page cannot be successfully corrected, performing a read-retry operation on the first weak page by using a plurality of read voltages in a read-retry table;
 when the data of the first weak page cannot be corrected by using the read voltage, executing the step of reading the first strong page paired with the first weak page to correct the data of the first weak page.

14. The data maintenance method as claimed in claim 12, wherein the flash memory further comprises a plurality of word lines, and each of the word lines comprises one of the strong pages and one of the weak pages, wherein the strong page belongs to the word line that is different from the word line of the paired weak page.

15. The data maintenance method as claimed in claim 14, wherein the flash memory operates as a Multi-Level Cell, the flash memory further comprises a plurality of middle pages, and each of the word lines comprises one of the strong pages, one of the middle pages, and one of the weak pages.

16. The data maintenance method as claimed in claim 12, wherein each of the strong pages comprises error-correction information of the paired weak page.

17. The data maintenance method as claimed in claim 12, wherein when the data of the first weak page cannot be corrected, the step of reading the first strong page to correct the data of the first weak page is arranged to obtain first error-correction information corresponding to the first weak page paired with the first strong page, and the data maintenance method further comprises:
 correcting the data of the first weak page according to the first error-correction information.

18. The data maintenance method as claimed in claim 17, wherein the step of correcting the data of the first weak page according to the first error-correction information further comprises:
 correcting a first parity code of the first weak page by using the first error-correction information;
 when the first parity code is successfully corrected by the first error-correction information, correcting the data of the first weak page by using the corrected first parity code; and
 when the first error-correction information cannot be successfully corrected by the first parity code, invalidating the data of the first weak page and moving the data of the block comprising the first weak page to another block.

19. The data maintenance method as claimed in claim 18, wherein when the data of the first parity code cannot be successfully corrected by the first error-correction information, the step of invalidating the data of the first weak page and moving the data of the block having the first weak page to another block further comprises:
 repeatedly reading the first strong page by using a plurality of read voltages in a read-retry table;

correcting the first parity code by using the first error-correction information which is obtained by repeatedly reading the first strong page;

when the first parity code is successfully corrected by the first error-correction information which is obtained by repeatedly reading the first strong page, correcting the data of the first weak page by using the corrected first parity code; and when the first parity code cannot be successfully corrected by the first error-correction information which is obtained by repeatedly reading the first strong page, executing the step of invalidating the data of the first weak page and moving the data of the block having the first weak page to another block.

20. The data maintenance method as claimed in claim 18, wherein when the first parity code is successfully corrected by the first error-correction information, the step of correcting the data of the first weak page by using the corrected first parity code further comprises:

when the data of the first weak page cannot be successfully corrected by using the corrected first parity code, repeatedly reading the first weak page by using a plurality of read voltages in a read-retry table;

correcting the data of the first weak page, which is obtained by repeatedly reading the first weak page, by using the corrected first parity code; and when the data of the first weak page, which is obtained by repeatedly reading the first weak page, still cannot be corrected by the corrected first parity code, invalidating the data of the first weak page and moving data of the block having the first weak page to another block.

* * * * *